US007525334B2

(12) United States Patent
Shimizume et al.

(10) Patent No.: US 7,525,334 B2
(45) Date of Patent: Apr. 28, 2009

(54) LIQUID-CRYSTAL DISPLAY DEVICE, DEFECTIVE PIXEL EXAMINATION METHOD, DEFECTIVE PIXEL EXAMINATION PROGRAM, AND STORAGE MEDIUM

(75) Inventors: Kazutoshi Shimizume, Kanagawa (JP); Kazuyuki Miyazawa, Nagasaki (JP); Shinichi Koga, Nagasaki (JP)

(73) Assignee: Sony Corporation (JP)

( * ) Notice: Subject to any disclaimer, the term of this patent is extended or adjusted under 35 U.S.C. 154(b) by 212 days.

(21) Appl. No.: 11/446,364

(22) Filed: Jun. 5, 2006

(65) Prior Publication Data

US 2006/0284646 A1 Dec. 21, 2006

(30) Foreign Application Priority Data

Jun. 13, 2005 (JP) .......................... P2005-172222

(51) Int. Cl.
*G01R 31/00* (2006.01)

(52) U.S. Cl. ...................................................... 324/770

(58) Field of Classification Search ................. 324/765, 324/770, 158.1, 760, 763; 349/189, 12, 192, 349/54, 99, 40–41
See application file for complete search history.

(56) References Cited

U.S. PATENT DOCUMENTS 5,745,090 A * 4/1998 Kim et al. ..................... 345/90
6,995,741 B2 * 2/2006 Ishiyama .................... 345/100

FOREIGN PATENT DOCUMENTS

JP 2002-351430 12/2002
JP 2004-226551 8/2004
JP 2006-308630 11/2006

OTHER PUBLICATIONS

Japanese Office Action issued Sep. 9, 2008 for corresponding Japanese Application No. 2005-172222.

* cited by examiner

*Primary Examiner*—Ha T. Nguyen
*Assistant Examiner*—Tung X Nguyen
(74) *Attorney, Agent, or Firm*—Rader Fishman & Grauer PLLC; Ronald P. Kananen

(57) ABSTRACT

A defective pixel examination method includes the steps of applying different voltages to a capacitive element of a first pixel section and a capacitive element of a second pixel section among the plurality of pixel sections; turning on a switch provided between an input electrode of a pixel transistor in the first pixel section and an input electrode of a pixel transistor in the second pixel section and short-circuiting the input electrode of the first pixel transistor and the input electrode of the second pixel transistor; reading a voltage of the capacitive element of the first pixel section and a voltage of the capacitive element of the second pixel section; and detecting defects of a pixel section on the basis of the result of the comparison between the voltage of the capacitive element of the first pixel section and the voltage of the capacitive element of the second pixel section.

4 Claims, 4 Drawing Sheets

LIQUID-CRYSTAL DISPLAY DEVICE, DEFECTIVE PIXEL EXAMINATION METHOD, DEFECTIVE PIXEL EXAMINATION PROGRAM, AND STORAGE MEDIUM

CROSS REFERENCES TO RELATED APPLICATIONS

The present invention contains subject matter related to Japanese Patent Application JP 2005-172222 filed in the Japanese Patent Office on Jun. 13, 2005, the entire contents of which are incorporated herein by reference.

BACKGROUND OF THE INVENTION

1. Field of the Invention

The present invention relates to a liquid-crystal display device, a defective pixel examination method for use with the liquid-crystal display device, a defective pixel examination program, and a storage medium, and, more particularly, relates to the examination of pixel defects.

2. Description of the Related Art

In recent years, display devices have rapidly become thinner, and, for example, liquid-crystal devices (LCDs) have become widely popular. Since such liquid-crystal display devices feature a low profile, a low weight, and a low power consumption, their use in so-called mobile terminals, such as, in particular, mobile phones, personal digital assistants (PDAs), notebook personal computers, and portable TVs, has increased. Furthermore, liquid-crystal display devices have begun to be used in rear projectors, front projectors, and the like.

Among such liquid-crystal display devices, an active-matrix liquid-crystal display device has become dominant. An active-matrix liquid-crystal display device is structured in such a manner that a substrate having transparent pixel electrodes and thin-film transistors (TFTs) arranged thereon, and an opposing substrate having one transparent electrode formed on the whole display section are provided, and these substrates are disposed to oppose each other with a liquid crystal sealed therebetween. By controlling the TFT having a switching function, a voltage corresponding to a pixel gradation (hereinafter referred to as a "gradation voltage") is applied to each pixel electrode, and an electrical potential difference between each pixel electrode and the electrode of the opposing substrate is generated, thereby changing the transmittance of the liquid crystal and enabling the display of an image.

On the substrate having TFTs arranged thereon, a plurality of data signal lines for applying a gradation voltage to each pixel electrode and a plurality of gate signal lines for applying a control signal for switching the TFTs are arranged. Application of a gradation voltage to each pixel electrode is performed via data signal lines, and during one frame period for image display, application of a gradation voltage to all the pixel electrodes connected to the data signal lines is performed, thereby enabling the display of an image on the liquid-crystal display section. The gradation voltage applied to each pixel electrode in this manner is held by the capacitive element (capacitor) provided in the output electrode of each TFT until a gradation voltage is next applied.

Such liquid-crystal display devices have commonly been of a transmission type, but recently a reflection-type liquid-crystal display device, such as a liquid-crystal-on silicon (LCOS) display device, has begun to be introduced to the market. For this LCOS, since a silicon wafer can be used as a substrate, transistors with a higher performance than that of transmission-type transistors, whose circuits are formed of polysilicon on a glass substrate, can be used.

SUMMARY OF THE INVENTION

Such a liquid-crystal display device is formed of a large number of pixel sections. In order to examine these pixel sections, a method in which a liquid-crystal display panel is actually driven, an image displayed thereon is analyzed by an image processing device in order to perform defective pixel examination, or defective pixels are detected by a visual check is adopted. However, in such a method, a liquid-crystal display device is actually driven, and an examination is performed after an image is displayed. Thus, the measurement takes time, and also the examination cannot be performed before a liquid crystal has been injected.

As a method of defective pixel examination, a method for measuring leakage current using a LSI tester has also been adopted. This method enables leakage current of the order of μA to be measured. However, in a LCOS liquid-crystal display device, the capacity of the above-described capacitive element is several tens of fF (femtofarads). For example, in the case of a specification in which a signal of 10 V is held at 50 fF for 10 ms, leakage current less than or equal to 50 pA needs to be measured, and thus an examination cannot be performed by this method.

Accordingly, in Japanese Unexamined Patent Application Publication No. 2004-226551, a liquid-crystal display device capable of examining defective pixels thereof with a high accuracy and shortening the examination time, and an examination method for use therewith have been proposed.

In the liquid-crystal display device, after a different voltage is applied to each of a pair of pixel sections, the same voltage is applied as a reference voltage to all the data signal lines so that the data signal lines are precharged, and thereafter, by reading the voltages stored in the pixel sections in a pair and comparing them, defective pixels are detected.

In the liquid-crystal display device disclosed in Japanese Unexamined Patent Application Publication No. 2004-226551, when a reference voltage is to precharge data signal lines, the reference voltage needs to be input from an input terminal. For this reason, it is necessary to generate, at an input terminal, a reference voltage corresponding to a voltage during writing. Furthermore, a circuit and processing for generating a reference voltage are necessary.

Accordingly, it is desirable to provide a liquid-crystal display device capable of easily precharging data signal lines without generating a reference voltage (hereinafter also referred to as an "intermediate voltage") for precharging data signal lines, and an examination method for use with the liquid-crystal display device.

According to an embodiment of the present invention, there is provided a defective pixel examination method for use with a liquid-crystal display device including a plurality of pixel sections each having a pixel transistor, a capacitive element connected to an output electrode of the pixel transistor, and a liquid-crystal section for performing gradation display based on a voltage held in the capacitive element, the defective pixel examination method including the steps of: applying different voltages to a capacitive element of a first pixel section and a capacitive element of a second pixel section among the plurality of pixel sections; turning on a switch provided between an input electrode of a pixel transistor in the first pixel section and an input electrode of a pixel transistor in the second pixel section and short-circuiting the input electrode of the first pixel transistor and the input electrode of the second pixel transistor; reading a voltage of the capacitive element of the first pixel section and a voltage of the capacitive element of the second pixel section; and detecting a defect of a pixel section on the basis of the result of the comparison between the voltage of the capacitive element of the first pixel section and the voltage of the capacitive element of the second pixel section.

According to another embodiment of the present invention, there is provided a defective pixel examination method for use with a liquid-crystal display device including a plurality of pixel sections each having a pixel transistor, a capacitive element connected to an output electrode of the pixel transistor, and a liquid-crystal section for performing gradation display based on a voltage held in the capacitive element, the defective pixel examination method including the steps of: turning on a first transistor connected to an input electrode of a first pixel section among the plurality of pixel sections in order to apply a first voltage to the input electrode and turning on a pixel transistor of the first pixel section in order to apply the first voltage to a capacitive element of the first pixel section; turning on a second transistor connected to an input electrode of a second pixel section among the plurality of pixel sections in order to apply a second voltage to the input electrode and turning on a pixel transistor of the second pixel section in order to apply the second voltage to a capacitive element of the second pixel section; turning off the first transistor and the second transistor and turning off the pixel transistor of the first pixel section and the pixel transistor of the second pixel section; turning on, for a predetermined period of time, a switch provided between the input electrode of the pixel transistor in the first pixel section and the input electrode of the pixel transistor in the second pixel section, thereby short-circuiting the input electrodes of the pixel transistors; after the predetermined period of time has passed, turning on the pixel transistor of the first pixel section and the pixel transistor of the second pixel section and reading a voltage of the capacitive element of the first pixel section and a voltage of the capacitive element of the second pixel section; and comparing the read voltage of the capacitive element of the first pixel section with the read voltage of the capacitive element of the second pixel section.

According to the embodiment of the present invention, the step of comparing the voltage of the capacitive element of the first pixel section with the voltage of the capacitive element of the second pixel section may be performed by a sense amplifier.

According to another embodiment of the present invention, there is provided a liquid-crystal display device including: a plurality of pixel sections, each of the pixel sections including a pixel transistor, a capacitive element connected to an output electrode of the pixel transistor, and a liquid-crystal section for performing gradation display based on a voltage held in the capacitive element; a first data signal line connected to an input electrode of a first pixel section among the plurality of pixel sections; a second data signal line connected to an input electrode of a second pixel section among the plurality of pixel sections; a first transistor capable of supplying a first test signal to the first data signal line; a second transistor capable of supplying a second test signal to the second data signal line; a gate signal line connected between a control electrode of a pixel transistor of the first pixel section and a control electrode of a pixel transistor of the second pixel section; a switch provided so as to be connected between the first data signal line and the second data signal line; and a comparison circuit for comparing a voltage of the first data signal line with a voltage of the second data signal line, and wherein the switch electrically short-circuits the first data signal line and the second data signal line and enables control in which the voltage of the first data signal line and the voltage of the second data signal line are made to be intermediate voltages.

According to the embodiment of the present invention, the comparison circuit may be a sense amplifier, and the sense amplifier may compare the voltage of the capacitive element of the first pixel section with the voltage of the capacitive element of the second pixel section, and may amplify and output the difference.

The liquid-crystal display device may further include a voltage inversion input circuit for switching between the first test signal and the second test signal.

According to another embodiment of the present invention, there is provided a defective pixel examination program for examining defects of pixel sections in a liquid-crystal display device including a plurality of pixel sections each having a pixel transistor, a capacitive element connected to an output electrode of the pixel transistor, and a liquid-crystal section for performing gradation display based on a voltage held in the capacitive element, the defective pixel examination program enabling a computer to perform: a function for applying different voltages to a capacitive element of a first pixel section and a capacitive element of a second pixel section among the plurality of pixel sections; a function for turning on a switch provided between an input electrode of a pixel transistor in the first pixel section and an input electrode of a pixel transistor in the second pixel section and for short-circuiting the input electrode of the first pixel transistor and the input electrode of the second pixel transistor; a function for reading a voltage of the capacitive element of the first pixel section and a voltage of the capacitive element of the second pixel section; and a function for detecting a defect of a pixel section on the basis of the result of the comparison between the voltage of the capacitive element of the first pixel section and the voltage of the capacitive element of the second pixel section.

According to another embodiment of the present invention, there is provided a recording medium having recorded thereon the defective pixel examination program in a computer-readable format.

According to the embodiment of the present invention, by turning on a switch, such as a transistor, provided between the input electrode of the pixel transistor in the first pixel section and the input electrode of the pixel transistor in the second pixel section, the input electrode of the first pixel transistor and the input electrode of the second pixel transistor are short-circuited. Therefore, data signal lines can be easily precharged to intermediate voltages using the switch without generating an intermediate voltage that is a reference voltage for precharging the data signal lines.

According to the embodiment of the present invention, the comparison between the voltage of the capacitive element of the first pixel section and the voltage of the capacitive element of the second pixel section is performed by a sense amplifier. Therefore, the amount of leakage can be detected with accuracy, and the accuracy of detecting defects of pixel sections can be improved.

According to the embodiment of the present invention, a switch, such as a transistor, is provided between the input electrode of the pixel transistor in the first pixel section and the input electrode of the pixel transistor in the second pixel section, the first data signal line and the second data signal line are electrically short-circuited, and control in which the voltage of the first data signal line and the voltage of the second data signal line are made to be intermediate voltages is enabled. Therefore, the data signal lines can be easily precharged to intermediate voltages using the switch without generating an intermediate voltage that is a reference voltage for precharging the data signal lines.

According to the embodiment of the present invention, a voltage inversion input circuit for switching between the first test signal and the second test signal is provided. Therefore, inversion of these signals can be easily performed.

DESCRIPTION OF THE PREFERRED EMBODIMENTS

Figure 1:
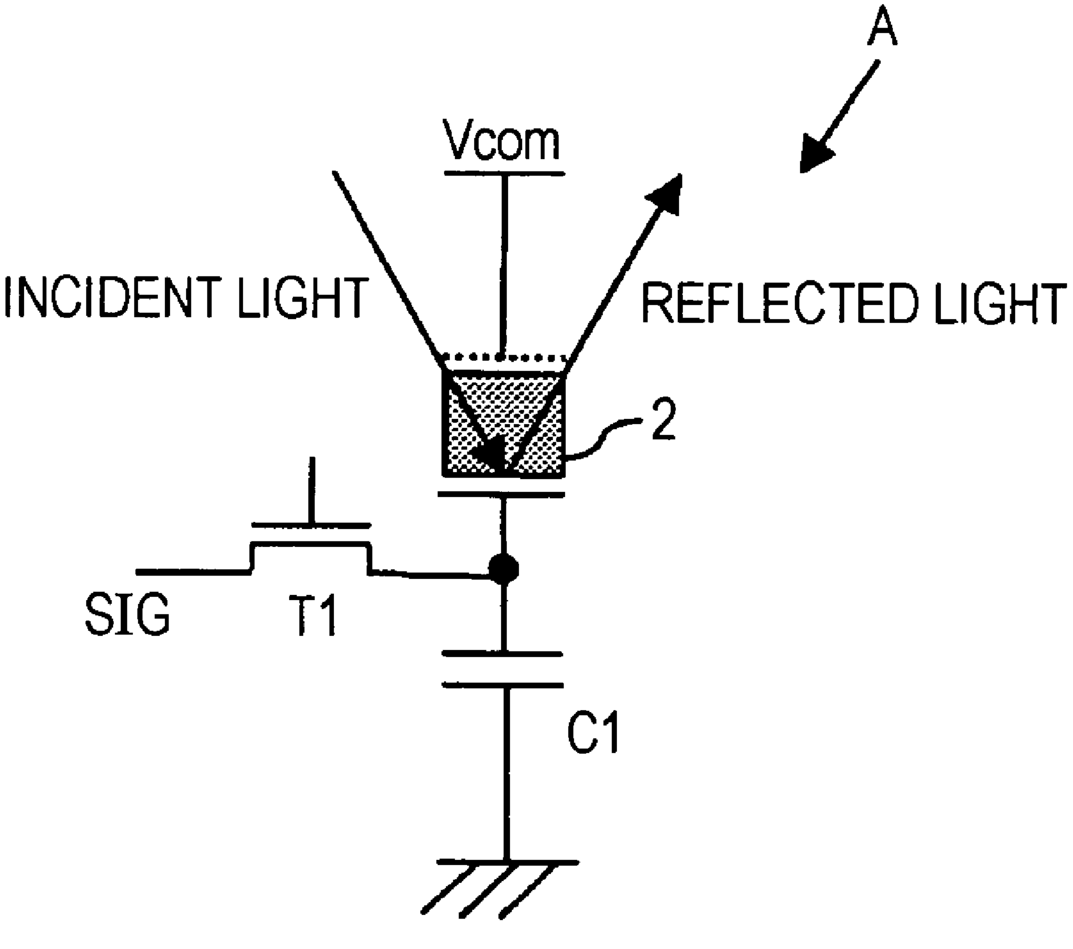
FIG. 1 shows the configuration of a pixel section according to an embodiment of the present invention.
Figure 2:
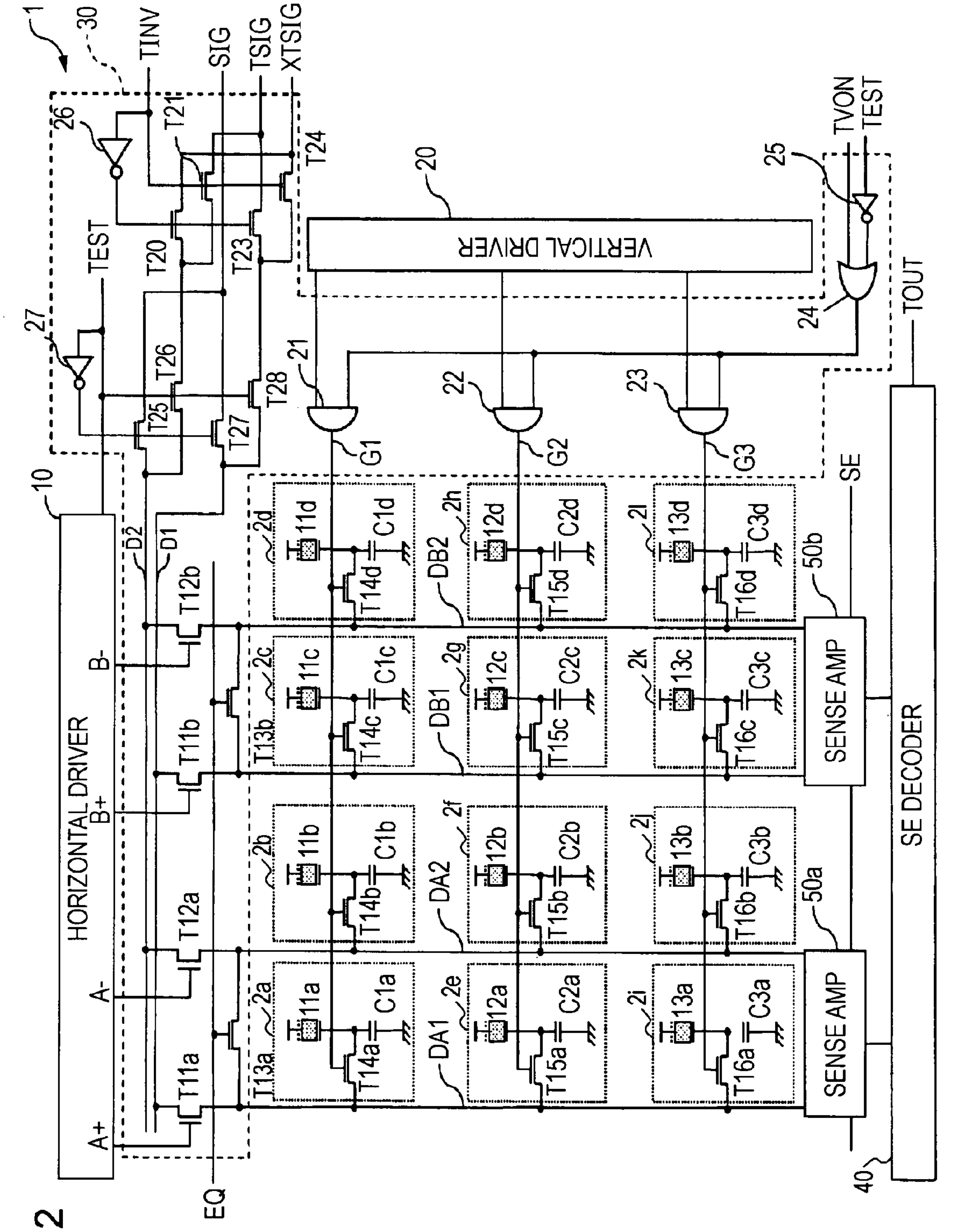
FIG. 2 shows the configuration of a liquid-crystal display device according to the embodiment of the present invention.

Embodiments of the present invention will now be described below. FIG. 1 shows the configuration of a pixel section of a liquid-crystal display device according to an embodiment of the present invention. FIG. 2 shows the configuration of the liquid-crystal display device according to the embodiment of the present invention.

First, with reference to FIG. 1, a description will be given of the configuration and operation of a plurality of pixel sections A provided in matrix in a liquid-crystal display device 1.

As shown in FIG. 1, the pixel section A is configured to have a pixel transistor T1, a capacitive element C1, and a liquid-crystal section 2. An input electrode of the pixel transistor T1 is connected to a data signal line, and an output electrode is connected to one end of the capacitive element C1 and to the pixel electrode of the liquid-crystal section 2. The other end of the capacitive element C1 is connected to a ground.

A control electrode of the pixel transistor T1 is connected to a gate signal line, and the on/off state of the pixel transistor T1 is controlled on the basis of a signal of the gate signal line. That is, when a high voltage is applied to the gate signal line, the pixel transistor T1 is turned on, and the voltage of the data signal line is applied to the capacitive element C1 and the liquid-crystal section 2.

When the voltage is applied to the liquid-crystal section 2, the reflectance of the liquid crystal is controlled on the basis of the applied voltage, making gradation display control possible. Furthermore, since the capacitive element C1 is arranged, even after the pixel transistor T1 is turned off, the applied voltage is held in the capacitive element C1 so that the reflected amount of the liquid crystal is continuously maintained.

As described above, the pixel section A is configured to have the pixel transistor T1, the capacitive element C1 connected to the output electrode of the pixel transistor T1, and the liquid-crystal section 2 for performing gradation display based on the voltage held in the capacitive element C1.

Next, with reference to FIG. 2, a description will be given, of the configuration and operation of the liquid-crystal display device 1 in which a plurality of such pixel section A is arranged in a two-dimensional matrix. In this embodiment, in order to facilitate understanding, the pixel sections are arranged in a 4×3 matrix.

The liquid-crystal display device 1 according to this embodiment includes a plurality of pixel sections 2*a* to 2*l*, a horizontal driver 10, a vertical driver 20, a logic circuit 30 for checking purposes, a decoder 40, and sense amplifiers 50*a* and 50*b*.

Input electrodes of pixel transistors T14*a*, T15*a*, and T16*a* in pixel sections 2*a*, 2*e*, and 2*i* are connected to a data signal line DA1. Input electrodes of pixel transistors T14*b*, T15*b*, and T16*b* in pixel sections 2*b*, 2*f*, and 2*j* are connected to a data signal line DA2. Input electrodes of pixel transistors T14*c*, T15*c*, and T16*c* in pixel sections 2*c*, 2*g*, and 2*k* are connected to a data signal line DB1. Input electrodes of pixel transistors T14*d*, T15*d*, and T16*d* in pixel sections 2*d*, 2*h*, and 2*l* are connected to a data signal line DB2.

Control electrodes of the pixel transistors T14*a* to T14*d* in the pixel sections 2*a* to 2*d* are connected to a gate signal line G1. Control electrodes of the pixel transistors T15*a* to T15*d* in the pixel sections 2*e* to 2*h* are connected to a gate signal line G2. Control electrodes of the pixel transistors T16*a* to T16*d* in the pixel sections 2*i* to 2*l* are connected to a gate signal line G3. The data signal lines DA1 and DB1 correspond to the first data signal line, and the data signal lines DA2 and DB2 correspond to the second data signal line. The gate signal line is provided for each horizontal line. Liquid-crystal sections 11*a* to 11*d*, 12*a* to 12*d*, and 13*a* to 13*d* are provided in output electrodes of pixel transistors T14*a* to T14*d*, T15*a* to T15*d*, T16*a* to T16*d*, respectively.

[Description of the Horizontal Driver 10]

The horizontal driver 10 includes a shift register circuit and a test logic circuit, and switching between the shift register circuit and the test logic circuit is performed in accordance with input from a TEST signal. That is, when the TEST signal is at a low voltage, the shift register circuit operates, and when the TEST signal is at a high voltage, the test logic circuit operates.

[Description of the Vertical Driver 20]

The vertical driver 20 is a circuit for applying a low-voltage or high-voltage gate signal to each of the gate signal lines G1 to G3. When the vertical driver 20 outputs a high-voltage gate signal to one of the gate signal lines, the vertical driver 20 outputs a low-voltage gate signal to the other gate signal lines.

[Description of the Checking Logic Circuit 30]

The checking logic circuit 30 is a circuit for switching between a test mode for examining the pixel sections 2*a* to 2*l* and a normal operation mode for displaying an image by the pixel sections 2*a* to 2*l*, and for performing various switching operations during the test mode for examining the pixel sections 2*a* to 2*l*.

The checking logic circuit 30 includes; transistors T11*a*, T11*b*, T12*a*, T12*b*, T20, T21, T23 to T28, and inverter circuits 26 and 27 for switching signals to be supplied to the data signal lines DA1, DA2, DB1, and DB2 (hereinafter referred to as a "signal switching circuit"); transistors T13*a* and T13*b* having a switching function for electrically connecting between the data signal lines DA1 and DA2 and between the data signal lines DB1 and DB2, respectively (hereinafter referred to as an "equalizer section"); and an OR circuit 24, an inverter circuit 25, and AND circuits 21 to 23 for controlling output from the vertical driver 20 to the gate signal lines G1 to G3 (hereinafter referred to as a "gate signal line control section").

[Description of the Signal Switching Circuit]

The signal switching circuit is a circuit for selecting which of a first test signal TSIG, a second test signal XTSIG, or an image displaying signal SIG should be used for the signal input to each of the data signal lines DA1, DA2, DB1, and DB2. The configuration thereof will be described below.

The first test signal TSIG is input to the input electrodes of the transistors T21 and T23, and the second test signal XTSIG is input to the input electrodes of the transistors T20 and T24. An inversion signal TINV is input to the control electrodes of the transistors T21 and T24, and a signal such that the inversion signal TINV is inverted is input to the control electrodes of the transistors T20 and T23 via an inverter circuit 26.

The output electrodes of the transistors T20 and T21 are connected to the input electrode of the transistor T26, and the output electrodes of the transistors T23 and T24 are connected to the input electrode of the transistor T28. The output electrode of the transistor T27, together with the output electrode of the transistor T28, is connected to a data signal line D1, and the output electrode of the transistor T25, together with the output electrode of the transistor T26, is connected to a data signal line D2. The input electrodes of the transistors T25 and T27 are connected to the image displaying signal SIG. A test signal TEST is input to the control electrodes of the transistors T26 and T28, and an inversion signal of the test signal TEST is input to the control electrodes of the transistors T25 and T27 via an inverter circuit 27.

The control electrodes (gates) of the transistors T11*a*, T12*a*, T11*b*, and T12*b* are connected to the outputs A+, A−, B+, and B− of the horizontal driver 10, respectively, and the output electrodes (sources) thereof are connected to the data signal lines DA1, DA2, DB1, and DB2, respectively. The input electrodes (drains) of the transistors T11*a* and T12*a* are connected to the data signal lines D1 and D2, respectively, and are connected to the output electrodes of the transistors T28 and T26, respectively. The same applies to the input electrodes (drains) of the transistors T11*b* and T12*b*.

Since the signal switching section is configured in the manner described above, for example, when the first test signal TSIG is to be supplied to the data signal line D1 and the second test signal XTSIG is to be supplied to the data signal line D2, the inversion signal TINV is brought to a low-voltage level and the test signal TEST is brought to a high-voltage level. Conversely, when the second test signal XTSIG is to be supplied to the data signal line D1 and the first test signal TSIG is to be supplied to the data signal line D2, the inversion signal TINV is brought to a high-voltage level and the test signal TEST is brought to a high-voltage level. By inputting a high voltage from the horizontal driver 10 to each of the control electrodes of the transistors T11*a*, T12*a*, T11*b*, and T12*b*, the signals of the data signal lines D1 and D2 can be supplied to the data signal lines DA1, DA2, DB1, and DB2, respectively.

The transistors T20, T21, T23, and T24, and the inverter circuit 26 constitute a voltage inversion input circuit for switching between the first test signal TSIG and the second test signal XTSIG.

[Description of the Equalizer Section]

The equalizer section is formed of transistors T13*a* and T13*b* serving as switches. The transistor T13*a* is connected between the data signal line DA1 and the data signal line DA2. By short-circuiting between these data signal lines by low impedance, the voltages of the data signal lines DA1 and DA2 are made to be intermediate voltages between these voltages before being short-circuited. For example, when the transistor T13*a* is turned on for a predetermined period of time when 4 V is applied to the data signal line DA1 and 5 V is applied to the data signal line DA2, the voltages of the data signal lines DA1 and DA2 become 4.5 V, which is an intermediate voltage thereof. Similarly, the transistor T13*b* is connected between the data signal line DB1 and the data signal line DB2. By short-circuiting between these data signal lines by low impedance, the voltages of the data signal lines DB1 and DB2 are made to be an intermediate voltage between these voltages before being short-circuited.

This transistor T13*a* is turned on when the transistors T11*a* and T12*a* are turned off (that is, they are brought to a high impedance state) and when the pixel transistors T14*a*, T14*b*, T15*a*, T15*b*, T16*a*, and T16*b* are turned off. Similarly, the transistor T13*b* is turned on when the transistors T11*b* and T12*b* are turned off (that is, they are brought to a high impedance state) and when the pixel transistors T14*c*, T14*d*, T15*c*, T15*d*, T16*c*, and T16*d* are turned off.

[Description of the Gate Signal Control Section]

The gate signal control section performs the control of whether or not a signal from the vertical driver 20 should be supplied to the gate signal lines G1 to G3 during the test mode. The test signal TEST is input to one of the inputs of the OR circuit 24 via the inverter circuit 25, and a vertical signal control signal TVON is input to the other input of the OR circuit 24. The output of the OR circuit 24 is input to one of the inputs of each of the AND circuits 21 to 23, and a gate signal from the vertical driver 20 is input to the other input of each of the AND circuits 21 to 23. The outputs of the AND circuits 21 to 23 are connected to the gate signal lines G1, G2, and G3, respectively.

Since the gate signal control section is configured in the manner described above, when the test signal TEST is high and when the vertical signal control signal TVON is low, a signal from the vertical driver 20 is not supplied to the gate signal lines G1, G2, and G3. Only when the vertical signal control signal TVON is high, a signal from the vertical driver 20 is supplied to the gate signal lines G1, G2, and G3.

[Description of the Decoder 40]

The decoder 40 is a circuit for outputting a differential amplified signal output from the sense amplifiers 50*a* and 50*b* as a TOUT signal. The TOUT signal that is output in this manner is read by a LSI tester 70 (to be described later), and a examination of defects for the pixel sections 2*a* to 2*l* is performed.

[Description of the Sense Amplifiers 50*a* and 50*b*]

The data signal lines DA1 and DA2 are connected to the inverting input and the non-inverting input of the sense amplifier 50*a*, respectively. The sense amplifier 50*a* compares these data signal lines DA1 and DA2 with each other in order to detect a voltage difference between them, amplifies the voltage difference, and then outputs it to the decoder 40. Similarly, the inverting input and the non-inverting input of the sense amplifier sob are connected to the data signal lines DB1 and DB2, respectively. The sense amplifier 50*b* compares these data signal lines with each other in order to detect a voltage difference between them, amplifies the voltage difference, and then outputs it to the decoder 40. The sense amplifiers 50*a* and 50*b* correspond to comparison circuits.

An enable signal SE is input to the sense amplifiers 50*a* and 50*b*. When the enable signal SE becomes high, the sense amplifiers 50*a* and 50*b* operate so that the output signal is amplified up to a maximum amplitude.

[Test Operation of the Liquid-Crystal Display Device]

Figure 3:
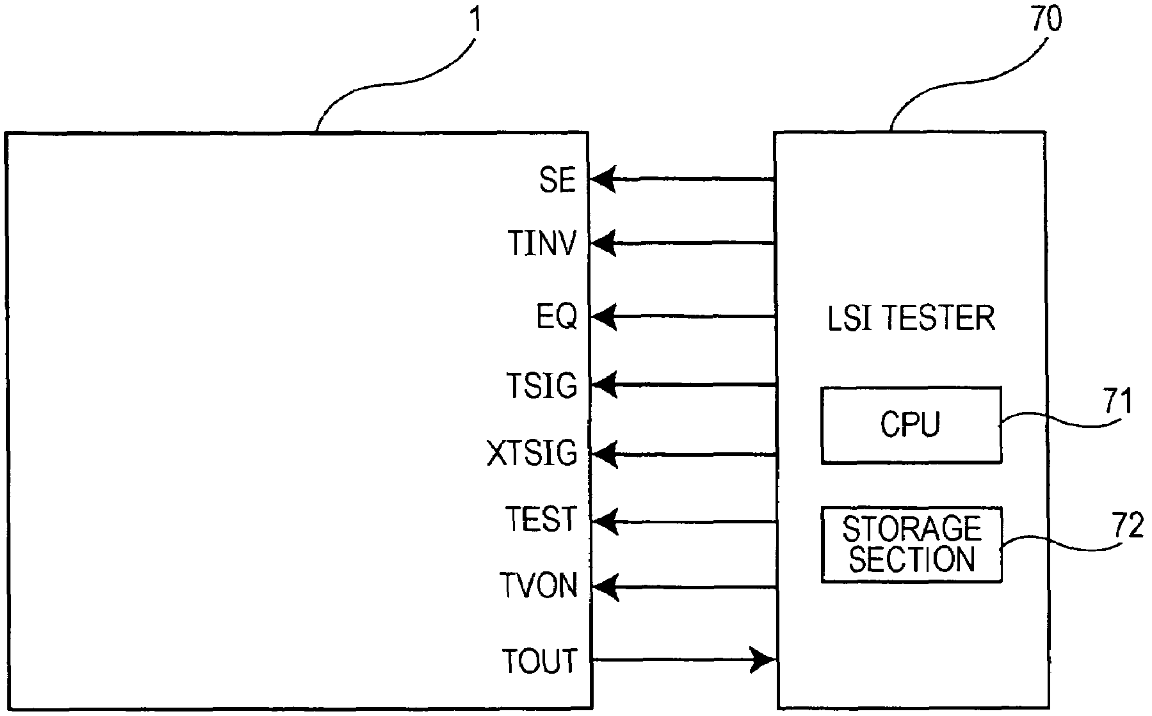
FIG. 3 shows a connection between the liquid-crystal display device according to the embodiment of the present invention and a LSI tester.
Figure 4:
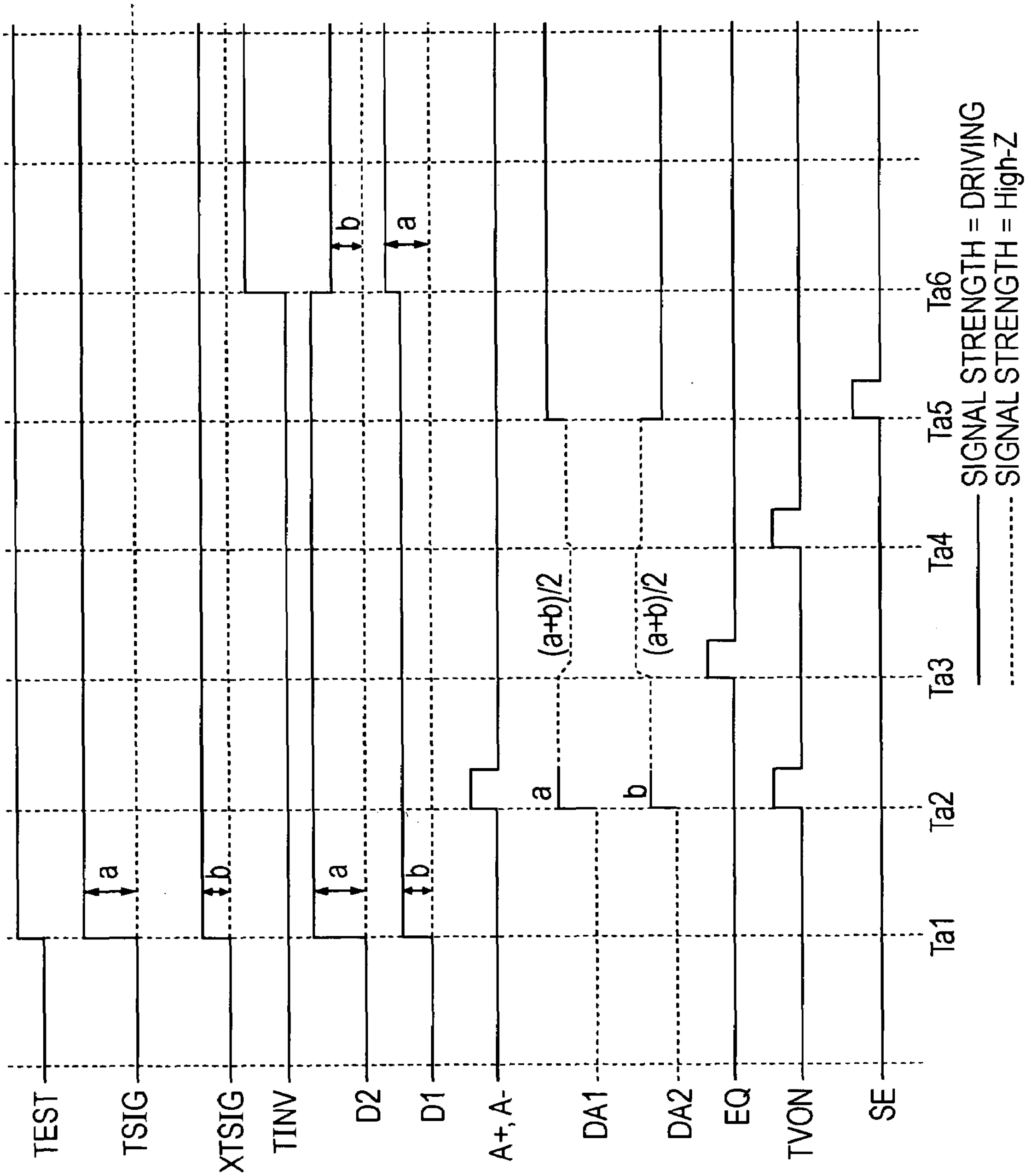
FIG. 4 is a timing chart for examination control for the liquid-crystal display device according to the embodiment of the present invention.

A description will be given specifically of a method of detecting defects of the pixel sections 2*a* to 2*l* of the liquid-crystal display device 1 configured as described above. FIG. 3 shows a connection between the liquid-crystal display device 1 and the LSI tester 70. In this embodiment, various kinds of control signals are input from the LSI tester 70 to the liquid-crystal display device 1, and based on the output signal TOUT output from the liquid-crystal display device 1, defects of the pixel sections 2*a* to 2*l* are detected. FIG. 4 is a timing chart during a test mode in the liquid-crystal display device 1. The LSI tester 70 corresponds to a computer for examining defects of the pixel sections.

The LSI tester 70 has a storage section 72 in which a CPU 71 and programs are stored. The CPU 71 performs functions that will be described below in detail by reading and executing a program (including a defective pixel examination program according to an embodiment of the present invention) stored in the storage section 72 and the like. The defective pixel examination program may be recorded on a storage medium, such as a CD-ROM, and the program on the storage medium may be read into the storage section 72 via a storage medium drive (not shown) of the LSI tester 70.

The test by the LSI tester 70 is broadly made up of four procedures: (a) an operation for writing a voltage to a capacitive element of a pixel section; (b) an operation for making voltages of a pair of data signal lines DA1 and DA2, or DB1 and DB2 into intermediate voltages; (c) an operation for reading a voltage of a capacitive element of a pixel section; and (d) an operation for comparing read voltages and detecting a defective pixel. In the liquid-crystal display device 1 according to this embodiment, defects of the pixel sections 2*a* to 2*l* can be detected. However, here, only the operation for detecting defects of the pixel sections 2*a* and 2*b* in a pair is described, and since the detection of defects of the other pixel sections is the same as for the pixel sections 2*a* and 2*b*, the descriptions thereof are omitted. The pixel section 2*a* corresponds to a first pixel section and the pixel section 2*b* corresponds to a second pixel section.

[Operation for Writing a Voltage to a Capacitive Element of a Pixel Section]

Initially, the LSI tester 70 brings the TEST signal to a high-voltage level, and supplies a first test signal TSIG and a second test signal XTSIG. Furthermore, the LSI tester 70 supplies a low voltage to the inversion signal TINV and supplies a low voltage to the vertical signal control signal TVON. As a result, the first test signal TSIG and the second test signal XTSIG are supplied to the data signal lines D1 and D2, respectively (see timing Ta1 in FIG. 4). In this embodiment, the voltage level of the first test signal TSIG is set as 4 V and the voltage level of the second test signal XTSIG is set as 5 V, but the voltage levels are not limited to these examples. The test signal is an analog signal of a DC voltage.

Next, the LSI tester 70 controls the horizontal driver 10 in order to output a high voltage to the transistors T11*a* and T12*a* so that the transistors T11*a* and T12*a* are turned on simultaneously. Furthermore, the LSI tester 70 brings the gate signal line G1 to a high-voltage level by bringing the signal to a high-voltage level and by setting the input of the AND circuit 21 to a high-voltage level by controlling the vertical driver 20. As described above, when the gate signal line G1 is brought to a high-voltage level, the pixel transistors T14*a* to T14*d* are turned on (see timing Ta2 in FIG. 4). As a consequence, the voltage of the first test signal TSIG is applied from the data signal line DA1 to the capacitive element C1*a* of the pixel section 2*a*, and the voltage is maintained. Similarly, the voltage of the second test signal XTSIG is applied from the data signal line DA2 to the capacitive element C1*b* of the pixel section 2*a*, and the voltage is maintained. In the manner described above, the voltage of the first test signal TSIG is written into the pixel section 2*a*, and the voltage of the second test signal XTSIG is written into the pixel section 2*b*.

When the writing into the pixel sections 2*a* and 2*b* is completed, the LSI tester 70 controls the horizontal driver 10 in order to output a low signal to the control electrodes of the transistors T11*a* and T12*a* so that the transistors T11*a* and T12*a* are turned off. Furthermore, the LSI tester 70 brings the gate signal line G1 to a low-voltage level by bringing the vertical signal control signal TVON to a low-voltage level or by bringing the input of the AND circuit 21 to a low-voltage level by controlling the vertical driver 20. As a consequence, the pixel sections 2*a* and 2*b* are turned off, and become a high impedance state because the input electrodes of the pixel transistors T14*a* and T14*b* of the pixel sections are disconnected from the first test signal TSIG and the second test signal XTSIG.

Here, since capacitance components exist in the data signal line DA1 and the data signal line DA2, the voltage level of the first test signal and the voltage level of the second test signal are maintained, respectively. That is, 4 V is held in the data signal line DA1, and 5 V is held in the data signal line DA2. In this embodiment, it is assumed that the capacitance components of the data signal line DA1 are the same as the capacitance components of the data signal line DA2.

[Operation for Making the Data Signal Lines DA1 and DA2 to be Intermediate Voltages]

Next, after the writing into the pixel sections 2*a* and 2*b* is completed, the LSI tester 70 waits for a predetermined period of time. Thereafter, the LSI tester 70 turns on the transistors T13*a* and T13*b* by bringing an averaged signal EQ to a high-voltage level. When the transistor T13*a* is turned on in this manner, the data signal line DA1 and the data signal line DA2 are short-circuited, and electrical current flows from the data signal line DA2 to the data signal line DA1. As a consequence, the voltages of the data signal lines DA1 and DA2 become an averaged voltage, which is 4.5 V in this embodiment (see timing Ta3 in FIG. 4). The LSI tester 70 maintains the high state of the averaged signal EQ for a predetermined period of time and thereafter returns the averaged signal EQ to a low-voltage level.

[Operation for Reading Voltages of Capacitive Elements of Pixel Sections]

Next, the LSI tester 70 brings the vertical signal control signal TVON to a high-voltage level and brings the gate signal line G1 to a high-voltage level from the vertical driver 20 via the AND circuit 21 so that the pixel transistors T14*a* and T14*b* are turned on (see timing Ta4 in FIG. 4). When the pixel transistor T14*a* is turned on in this manner, the voltage held by the capacitive element C1*a* is input to an inverting input terminal of the sense amplifier 50*a* via the data signal line DA1. Furthermore, as a result of the pixel transistor T14*b* being turned on, the voltage held by the capacitive element C1*b* is input to a non-inverting input terminal of the sense amplifier 50*a* via the data signal line DA2.

As described above, when the voltages held by the capacitive elements C1*a* and C1*b* are to be read, 4.5 V is held in the capacitance components of the data signal lines DA1 and DA2, and the capacitance components of the capacitive elements are smaller than the capacitance components of the data signal lines. Therefore, when the pixel sections 2*a* and 2*b* are not defective, a voltage slightly higher than the above-described intermediate voltage is input to the inverting input terminal of the sense amplifier 50*a*, and a voltage slightly lower than the above-described intermediate voltage is input to the non-inverting input terminal of the sense amplifier 50*a*. Such a voltage change corresponds to the ratio of the capacitance components of the data signal lines DA1 and DA2 to the capacitance components of the capacitive elements C1*a* and C1*b*. For example, when the capacitance components of the data signal line DA1 is 49 times as large as the capacitance components of the capacitive element C1*a*, a voltage of 4.51 V is input to the inverting input terminal of the sense amplifier 50*a*, and a voltage of 4.49 V is input to the non-inverting input terminal thereof.

[Operation for Comparing Read Voltages and for Detecting Defective Pixels]

Next, the sense amplifier 50*a* compares the voltage held by the capacitive element C1*a* with the voltage held by the capacitive element C1*b*, amplifies the voltage difference up to a maximum amplitude, and outputs it to the decoder 40 (see timing Ta5 in FIG. 4). The signals of DA1 and DA2 in the timing chart of FIG. 4 indicate voltages after being amplified by the sense amplifiers.

The difference signal output from the sense amplifier 50*a* in this manner is input, as an output signal TOUT that is coded by the decoder 40, to the LSI tester 70. The LSI tester 70 detects defects of the pixel sections 2*a* and 2*b* on the basis of whether the relative level of the electrical potential during writing into the pixel sections 2*a* and 2*b* is reversed. Here, since 4 V is applied to the pixel section 2*a* and 5 V is applied to the pixel section 2*b*, when the voltage read from the capacitive element C1*a* of the pixel section 2*a* is lower than the voltage read from the capacitive element C1*b* of the pixel section 2*b*, these pixels are not determined to be defective, but they are determined to be defective when the voltage read from the capacitive element C1*a* of the pixel section 2*a* is higher. Even in such a case, when the voltage difference is very small, since it can be determined that the amount of leakage is small, it is also possible that the pixels are not determined to be defective. By using the sense amplifier 50*a* as a comparison circuit in the manner described above, it is possible to detect the amount of leakage, and it becomes possible to more accurately distinguish between good products and bad products.

Thereafter, the input voltage is reversed, and the above-described test operations (a) to (d) are repeated. More specifically, in order that the second test signal is applied to the data signal line DA1 and the first test signal is applied to the data signal line DA2, the LSI tester 70 brings the inversion signal TINV to a high-voltage level (see timing Ta6 in FIG. 4), and the above-described test operations (a) to (d) are repeated. As described above, as a result of reversing the input voltage, it is possible to detect defects of both the pixel sections 2*a* and 2*b* in a pair. Furthermore, since the first test signal and the second test signal can be reversed by only switching the inversion signal TINV, this leads to a shortened test time.

By repeating the above-described test operations for each pair of pixel sections (two pixel sections of the same horizontal line), it becomes possible to detect defective pixels of the pixel sections 2*a* to 2*l*.

As described above, defects of the pixel sections 2*a* and 2*b* can be easily detected by the test operations (a) to (d). Furthermore, averaging of data signal lines becomes possible without generating a reference signal and thus becomes very easy.

In this embodiment, processes (a) to (d) are performed continuously with respect to a pair of pixel sections. Alternatively, the examination time can be shortened as a result of the processes (a) to (d) described below.

(a') The LSI tester 70 controls the horizontal driver 10 in order to turn on the transistors T11*a* and T12*a*, brings the inversion signal TINV to a low-voltage level, and brings the test signal to a high-voltage level, so that the first test signal TSIG and the second test signal XTSIG are supplied to the data signal lines DA1 and DA2, respectively.

Furthermore, the LSI tester 70 brings the TVON signal to a high-voltage level and controls the vertical driver 20 in order to turn on the gate signal line G1 for a predetermined period of time. This causes the pixel transistors T14*a* and T14*b* to be turned on for a predetermined period of time, and the test signals are written into the pixel sections 2*a* and 2*b*.

When the writing is completed, the LSI tester 70 controls the horizontal driver 10 in order to turn off the transistors T11*a* and T12*a* and in order to turn on the transistors T11*b* and T12*b*. As a result, the first test signal TSIG and the second test signal XTSIG are supplied to the data signal lines DB1 and DB2, respectively. Furthermore, the LSI tester 70 brings the TVON signal to a high-voltage level and controls the vertical driver 20 in order to turn on the gate signal line G1 for a predetermined period of time. As a result, the transistors T14*c* and T14*d* are turned on, and the test signals are written into the pixel sections 2*c* and 2*d*.

Next, the LSI tester 70 controls the horizontal driver 10 in order to turn off the transistors T11*b* and T12*b* and in order to turn on the transistors T11*a* and T12*a*. As a result, the first test signal TSIG and the second test signal XTSIG are supplied to the data signal lines DA1 and DA2, respectively. Furthermore, the LSI tester 70 brings the TVON signal to a high-voltage level and controls the vertical driver 20 in order to turn on the gate signal line G2 for a predetermined period of time. As a result, the transistors T15*a* and T15*b* are turned on for a predetermined period of time, and test signals are written into the pixel sections 2*e* and 2*f*.

Similarly, hereinafter, by assuming the pixel sections 2*g* and 2*h*, the pixel sections 2*i* and 2*j*, and the pixel sections 2*k* and 2*l* as a pair, writing of a test signal is performed in the above-described procedure.

(b') Next, the LSI tester 70 turns on the transistors T11*a*, T12*a*, T11*b*, and T12*b* so that the first test signal TSIG is applied to the data signal lines DA1 and DB1 and the second test signal XTSIG is applied to the data signal lines DA2 and DB2 for a predetermined period of time. Thereafter, the LSI tester 70 turns off the transistors T11*a*, T12*a*, T11*b*, and T12*b* and brings the averaged signal EQ to a high-voltage level so that the transistors T13*a* and T13*b* are turned on for a predetermined period of time. When the transistor T13*a* is turned on in this manner, the data signal line DA1 and the data signal line DA2 are short-circuited, and electrical current flows from the data signal line DA2 to the data signal line DA1. When the transistor T13*b* is turned on, the data signal line DB1 and the data signal line DB2 are short-circuited, and electrical current flows from the data signal line DB2 to the data signal line DB1.

(c') Next, the LSI tester 70 brings the TVON signal to a high-voltage level, controls the vertical driver 20 in order to turn on only the gate signal line G1, and controls the horizontal driver 10 in order to turn on all the pixel transistors T14*a*, T14*b*, T14*c*, and T14*d* of one horizontal line. When the pixel transistor T14*a* is turned on in this manner, the voltage held by the capacitive element C1*a* is input to the inverting input terminal of the sense amplifier 50*a* via the data signal line DA1. When the pixel transistor T14*b* is turned on, the voltage held by the capacitive element C1*b* is input to the non-inverting input terminal of the sense amplifier 50*a* via the data signal line DA2. When the pixel transistor T14*c* is turned on, the voltage held by the capacitive element C1*c* is input to the inverting input terminal of the sense amplifier 50*b* via the data signal line DB1. When the pixel transistor T14*d* is turned on, the voltage held by the capacitive element C1*d* is input to the non-inverting input terminal of the sense amplifier 50*b* via the data signal line DB2.

(d') Next, the LSI tester 70 brings the enable signal SE to a high-voltage level. As a result, the sense amplifiers 50*a* and 50*b* compare the voltages held by the capacitive elements C1*a* and C1*c* with the voltages held by the capacitive elements C1*b* and C1*d*, respectively, amplify voltage differences up to a maximum amplitude, and output them to the decoder 40.

Hereinafter, by performing the operations (b') to (d') with respect to each of the remaining two horizontal lines controlled by the gate signal lines G2 and G3, it is possible to perform an examination of defects for all the pixel sections 2*a* to 2*l*, and to shorten the examination time when compared to the above-described procedures (a) to (d).

Since the first test signal and the second test signal can be changed in an analog manner, a leakage of linear characteristics with respect to the voltage of a pixel section and also a leakage of non-linear characteristics with respect to the voltage of a pixel section can be detected.

Since any desired test signal pattern can be written, a leakage between adjacent pixels can also be detected. Furthermore, since a writing pattern can also be seen visually, applications to visual examination are also possible.

By controlling the time from when writing into a pixel section until reading therefrom, that is, the held time, it becomes possible to improve the accuracy of detection of leakage defects of the pixel sections.

Since any desired test signal voltage can be written, the dependence of leakage on electrical potential can also be detected. In addition, by performing the above-described tests by changing temperature, a predictive determination of the distinction between linear characteristic leakage and junction leakage can be made.

Since the position of a defective pixel section can be detected, a map of defective pixel sections can be created.

This test can be performed before and after a liquid crystal is injected and can also be used as a response speed test by shortening the test signal writing time and the test signal reading time.

In liquid-crystal display devices of the related art, since a comparator of a simple digital output is used as a comparison circuit, the amount of leakage cannot be detected. If the amount of leakage can be detected, detection of defects of pixel sections can be performed with higher accuracy. In this embodiment, since a sense amplifier is used, an amount of leakage, which cannot be detected in the related art, can be detected. As a consequence, detection of defects of pixel sections can be performed with higher accuracy.

In this embodiment, a defect test for pixel sections is performed using the LSI tester 70. Alternatively, a control section for tests may be provided in the liquid-crystal display device 1, this control section may accept the input of various kinds of control signals, and the control section may detect a defect of the pixel section on the basis of an output signal TOUT.

According to the embodiments of the present invention, a defective pixel examination method for use with a liquid-crystal display device described below, the liquid-crystal display device having components described below, a defective pixel examination program for executing functions described below, and a recording medium are realized.

The defective pixel examination method for use with a liquid-crystal display device (for example, a liquid-crystal display device 1) including a plurality of pixel sections (for example, pixel sections 2*a* to 2*l*) each having a pixel transistor (for example, pixel transistors T14*a* to T14*d*, T15*a* to T15*d*, and T16*a* to T16*d*), a capacitive element (for example, capacitive elements C1*a* to C1*d*, C2*a* to C2*d*, and C3*a* to C3*d*) connected to an output electrode of the pixel transistor, and a liquid-crystal section (for example, liquid-crystal sections 11*a* to 11*d*, 12*a* to 12*d*, and 13*a* to 13*d*) for performing gradation display based on a voltage held in the capacitive element is provided, the defective pixel examination method including the steps of: applying different voltages to a capacitive element (for example, the capacitive element C1*a*) of a first pixel section (for example, the pixel section 2*a*) and a capacitive element (for example, the capacitive element C1*b*) of a second pixel section (for example, the pixel section 2*b*) among the plurality of pixel sections; turning on a switch (for example, T13*a*) provided between an input electrode of a pixel transistor (for example, T14*a*) in the first pixel section and an input electrode of a pixel transistor (for example, T14*b*) in the second pixel section and short-circuiting the input electrode of the first pixel transistor and the input electrode of the second pixel transistor; reading a voltage of the capacitive element of the first pixel section and a voltage of the capacitive element of the second pixel section; and detecting a defect of a pixel section on the basis of the result of the comparison between the voltage of the capacitive element of the first pixel section and the voltage of the capacitive element of the second pixel section.

The defective pixel examination method for use with a liquid-crystal display device (for example, a liquid-crystal display device 1) including a plurality of pixel sections (for example, pixel sections 2*a* to 2*l*) each having a pixel transistor (for example, pixel transistors T14*a* to T14*d*, T15*a* to T15*d*, and T16*a* to T16*d*), a capacitive element (for example, capacitive elements C1*a* to C1*d*) connected to an output electrode of the pixel transistor, and a liquid-crystal section (for example, liquid-crystal sections 11*a* to 11*d*, 12*a* to 12*d*, and 13*a* to 13*d*) for performing gradation display based on a voltage held in the capacitive element is provided, the defective pixel examination method including the steps of: turning on a first transistor (for example, a transistor T11*a*) connected to an input electrode of a first pixel section (for example, a pixel section 2*a*) among the plurality of pixel sections in order to apply a first voltage to the input electrode and turning on a pixel transistor (for example, T14*a*) of the first pixel section in order to apply the first voltage to a capacitive element (for example, a capacitive element C1*a*) of the first pixel section; turning on a second transistor connected to an input electrode of a second pixel section (for example, a pixel section 2*b*) among the plurality of pixel sections in order to apply a second voltage to the input electrode and turning on a pixel transistor (for example, T14*b*) of the second pixel section in order to apply the second voltage to a capacitive element (for example, a capacitive element C1*b*) of the second pixel section; turning off the first transistor and the second transistor and turning off the pixel transistor of the first pixel section and the pixel transistor of the second pixel section; turning on, for a predetermined period of time, a switch (for example, T13*a*) provided between the input electrode of the pixel transistor in the first pixel section and the input electrode of the pixel transistor in the second pixel section, thereby short-circuiting the input electrodes of the pixel transistors; after the predetermined period of time has passed, turning on the pixel transistor of the first pixel section and the pixel transistor of the second pixel section and reading a voltage of the capacitive element of the first pixel section and a voltage of the capacitive element of the second pixel section; and comparing the read voltage of the capacitive element of the first pixel section with the read voltage of the capacitive element of the second pixel section.

In the defective pixel examination method, the step of comparing the voltage of the capacitive element of the first pixel section with the voltage of the capacitive element of the second pixel section is performed by a sense amplifier (for example, a sense amplifier 50*a*).

The liquid-crystal display device includes; a plurality of pixel sections (for example, pixel sections 2*a* to 2*l*), each of the pixel sections including: a pixel transistor (for example, pixel transistors T14*a* to T14*d*, T15*a* to T15*d*, and T16*a* to T16*d*); a capacitive element (for example, capacitive elements C1*a* to C1*d*, C2*a* to C2*d*, and C3*a* to C3*d*) connected to an output electrode of the pixel transistor; and a liquid-crystal section (for example, liquid-crystal sections 11*a* to 11*d*, 12*a* to 12*d*, and 13*a* to 13*d*) for performing gradation display based on a voltage held in the capacitive element; a first data signal line (for example, a data signal line DA1) connected to an input electrode of a first pixel section (for example, the pixel section 2*a*) among the plurality of pixel sections; a second data signal line (for example, a data signal line DA2) connected to an input electrode of a second pixel section (for example, the pixel section 2*b*) among the plurality of pixel sections; a first transistor (for example, a transistor T11*a*) capable of supplying a first test signal (for example, a first test signal TSIG) to the first data signal line; a second transistor (for example, a transistor T11*b*) capable of supplying a second test signal (for example, a second test signal XTSIG) to the second data signal line; a gate signal line (for example, a gate signal line G1) connected between a control electrode of a pixel transistor (for example, T14*a*) of the first pixel section and a control electrode of a pixel transistor (for example, T14*b*) of the second pixel section; a switch (for example, a transistor T13*a*) provided so as to be connected between the first data signal line and the second data signal line; and a comparison circuit (for example, a sense amplifier 50*a*) for comparing a voltage of the first data signal line with a voltage of the second data signal line; and wherein the switch electrically short-circuits the first data signal line and the second data signal line and enables control in which the voltage of the first data signal line and the voltage of the second data signal line are used as intermediate voltages.

In the liquid-crystal display device, the comparison circuit is a sense amplifier, and the sense amplifier can compare the voltage of the capacitive element of the first pixel section with the voltage of the capacitive element of the second pixel section, and can amplify and output the difference.

The liquid-crystal display device further includes a voltage inversion input circuit (for example, a transistor T20, T21, T23, or T24, or an inverter circuit 26) for switching between the first test signal and the second test signal.

The recording medium has recorded thereon in a computer-readable format the defective pixel examination program for examining defects of pixel sections in a liquid-crystal display device (for example, a liquid-crystal display device 1) including a plurality of pixel sections (for example, pixel sections 2*a* to 2*l*) each having a pixel transistor (for example, pixel transistors T14*a* to T14*d*, T15*a* to T15*d*, and T16*a* to T16*d*), a capacitive element (for example, capacitive elements C1*a* to C1*d*, C2*a* to C2*d*, and C3*a* to C3*d*) connected to an output electrode of the pixel transistor, and a liquid-crystal section (for example, liquid-crystal sections 11*a* to 11*d*, 12*a* to 12*d*, and 13*a* to 13*d*) for performing gradation display based on a voltage held in the capacitive element, the defective pixel examination program enabling a computer (for example, a LSI tester 70) to perform: a function for applying different voltages to a capacitive element (for example, a capacitive element C1*a*) of a first pixel section (for example, a pixel section 2*a*) and a capacitive element (for example, a capacitive element C1*b*) of a second pixel section (for example, a pixel section 2*b*) among the plurality of pixel sections; a function for turning on a switch (for example, T13*a*) provided between an input electrode of a pixel transistor (for example, T14*a*) in the first pixel section and an input electrode of a pixel transistor (for example, T14*b*) in the second pixel section and for short-circuiting the input electrode of the first pixel transistor and the input electrode of the second pixel transistor; a function for reading a voltage of the capacitive element of the first pixel section and a voltage of the capacitive element of the second pixel section; and a function for detecting a defect of a pixel section on the basis of the result of the comparison between the voltage of the capacitive element of the first pixel section and the voltage of the capacitive element of the second pixel section.

It should be understood by those skilled in the art that various modifications, combinations, sub-combinations and alterations may occur depending on design requirements and other factors insofar as they are within the scope of the appended claims or the equivalents thereof.

What is claimed is:

1. A defective pixel examination method for use with a liquid-crystal display device including a plurality of pixel sections each having a pixel transistor, a capacitive element connected to an output electrode of the pixel transistor, and a liquid-crystal section for performing gradation display based on a voltage held in the capacitive element, the defective pixel examination method comprising the steps of:

applying different voltages to a capacitive element of a first pixel section and a capacitive element of a second pixel section among the plurality of pixel sections;

turning on a switch provided between an input electrode of a pixel transistor in the first pixel section and an input electrode of a pixel transistor in the second pixel section and short-circuiting the input electrode of the first pixel transistor and the input electrode of the second pixel transistor;

reading a voltage of the capacitive element of the first pixel section and a voltage of the capacitive element of the second pixel section; and detecting a defect of a pixel section on the basis of the result of the comparison between the voltage of the capacitive element of the first pixel section and the voltage of the capacitive element of the second pixel section.

2. A defective pixel examination method for use with a liquid-crystal display device including a plurality of pixel sections each having a pixel transistor, a capacitive element connected to an output electrode of the pixel transistor, and a liquid-crystal section for performing gradation display based on a voltage held in the capacitive element, the defective pixel examination method comprising the steps of:

turning on a first transistor connected to an input electrode of a first pixel section among the plurality of pixel sections in order to apply a first voltage to the input electrode and turning on a pixel transistor of the first pixel section in order to apply the first voltage to a capacitive element of the first pixel section;

turning on a second transistor connected to an input electrode of a second pixel section among the plurality of pixel sections in order to apply a second voltage to the input electrode and turning on a pixel transistor of the second pixel section in order to apply the second voltage to a capacitive element of the second pixel section;

turning off the first transistor and the second transistor and turning off the pixel transistor of the first pixel section and the pixel transistor of the second pixel section;

turning on, for a predetermined period of time, a switch provided between the input electrode of the pixel transistor in the first pixel section and the input electrode of the pixel transistor in the second pixel section, thereby short-circuiting the input electrodes of the pixel transistors;

after the predetermined period of time has passed, turning on the pixel transistor of the first pixel section and the pixel transistor of the second pixel section and reading a voltage of the capacitive element of the first pixel section and a voltage of the capacitive element of the second pixel section; and comparing the read voltage of the capacitive element of the first pixel section with the read voltage of the capacitive element of the second pixel section.

3. The defective pixel examination method according to one of claims 1 and 2, wherein the voltage of the capacitive element of the first pixel section is compared with the voltage of the capacitive element of the second pixel section by using a sense amplifier.

4. A defective pixel examination computer program product for examining the defects of pixel sections in a liquid-crystal display device including a plurality of pixel sections each having a pixel transistor, a capacitive element connected to an output electrode of the pixel transistor, and a liquid-crystal section for performing gradation display based on a voltage held in the capacitive element, the defective pixel examination computer program product stored on a computer readable medium and configured to cause a computer to perform:

applying different voltages to a capacitive element of a first pixel section and a capacitive element of a second pixel section among the plurality of pixel sections;

turning on a switch provided between an input electrode of a pixel transistor in the first pixel section and an input electrode of a pixel transistor in the second pixel section and for short-circuiting the input electrode of the first pixel transistor and the input electrode of the second pixel transistor;

reading a voltage of the capacitive element of the first pixel section and a voltage of the capacitive element of the second pixel section; and detecting a defect of a pixel section on the basis of the result of the comparison between the voltage of the capacitive element of the first pixel section and the voltage of the capacitive element of the second pixel section.

* * * * *